United States Patent
Kluth

(10) Patent No.: US 6,777,275 B1
(45) Date of Patent: Aug. 17, 2004

(54) SINGLE ANNEAL FOR DOPANT ACTIVATION AND SILICIDE FORMATION

(75) Inventor: George Jonathan Kluth, Sunnyvale, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 402 days.

(21) Appl. No.: 09/712,234

(22) Filed: Nov. 15, 2000

(51) Int. Cl.$^7$ ................................................ H01L 21/84
(52) U.S. Cl. ........................ 438/166; 438/308; 438/664
(58) Field of Search ................................ 483/162, 166, 483/305, 308–495, 516, 660, 664–682, FOR 202, FOR 261, FOR 356, FOR 302

(56) References Cited

U.S. PATENT DOCUMENTS

| | | | | |
|---|---|---|---|---|
| 5,134,447 A | * | 7/1992 | Ng et al. | 257/607 |
| 5,994,175 A | | 11/1999 | Gardner et al. | |
| 6,326,289 B1 | * | 12/2001 | Rodder et al. | 438/592 |
| 6,335,253 B1 | * | 1/2002 | Chong et al. | 438/305 |
| 2001/0006147 A1 | * | 7/2001 | Fan | 204/192.3 |
| 2001/0012693 A1 | * | 8/2001 | Talwar et al. | 438/682 |
| 2002/0011598 A1 | * | 1/2002 | Yamazaki et al. | 257/72 |

* cited by examiner

*Primary Examiner*—George Fourson
*Assistant Examiner*—Thanh V Pham

(57) ABSTRACT

Metal silcides form low resistance contacts on semiconductor devices such as transistors. Conventional formation of semiconductor devices with metal silicide contacts requires multiple high temperature annealing steps, which can result in crystal damage from dislocations and increased leakage currents. A single, lower temperature annealing step is employed in the invention to produce semiconductor devices with the source/drain regions formed in amorphous regions of a semiconductor substrate and nickel silicide contacts over the source/drain regions. The amorphization of the source/drain regions allows a lower temperature anneal to be performed, and the use of nickel silicide permits a single anneal to be used to both activate the dopants and form the nickel silicide contacts.

23 Claims, 8 Drawing Sheets

SINGLE ANNEAL FOR DOPANT ACTIVATION AND SILICIDE FORMATION

TECHNICAL FIELD

The present invention relates to the field of manufacturing semiconductor devices and, more particularly, to an improved salicide process of forming metal silicide contacts.

BACKGROUND OF THE INVENTION

An important aim of ongoing research in the semiconductor industry is the reduction in the dimensions of the devices used in integrated circuits. Planar transistors, such as metal oxide semiconductor (MOS) transistors, are particularly suited for use in high-density integrated circuits. As the size of the MOS transistors and other active devices decreases, the dimension the size of the source/drain regions and gate electrodes, and the channel region of each device, decrease correspondingly.

The design of ever-smaller planar transistors with short channel lengths makes it necessary to provide very shallow source/drain junctions. Shallow junctions are necessary to avoid lateral diffusion of implanted dopants into the channel, since such a diffusion disadvantageously contributes to leakage currents and poor breakdown performance. Shallow source/drain junctions, for example on the order of 1,000 Å or less thick are generally required for acceptable performance in short channel devices.

Metal silicide contacts are typically used to provide low resistance contacts to source/drain regions and gate electrodes. The metal silicide contacts are conventionally formed by depositing a conductive metal, such as titanium, cobalt, tungsten, or nickel, on the source/drain regions and gate electrodes by physical vapor deposition (PVD), e.g. sputtering or evaporation; or by a chemical vapor deposition (CVD) technique. Subsequently, heating is performed to react the metal with underlying silicon to form a metal silcide layer on the source/drain regions and gate electrodes. The metal silicide has a substantially lower sheet resistance than the silicon to which it is bonded. Selective etching is then conducted to remove unreacted metal from the non-silicided areas, such as the dielectric sidewall spacers. Thus, the silicide regions are aligned only on the electrically conductive areas. This self-aligned silicide process is generally referred to as the "salicide" process.

A portion of a typical semiconductor device 40 is schematically illustrated in FIG. 1A and comprises a silicon-containing substrate 10 with source/drain regions 34 formed therein. Gate oxide layer 14 and gate electrode 16 are formed on the silicon-containing substrate 10. Sidewall spacers 30 are formed on opposing side surfaces 18 of gate electrode 16. Sidewall spacers 30 typically comprise silicon based insulators, such as silicon nitride, silicon oxide, or silicon carbide. The sidewall spacers 30 mask the side surfaces 18 of the gate 16 when metal layer 36 is deposited, thereby preventing silicide from forming on the gate electrode side surfaces 18.

After metal layer 36 is deposited, heating is conducted at a temperature sufficient to react the metal with underlying silicon in the gate electrode 16 and substrate surface 12 to form conductive metal silcide contacts 38 (FIG. 1B). After the metal silcide contacts 38 are formed, the unreacted metal 36 is removed by etching, as with a wet etchant, e.g., an aqueous $H_2O_2/NH_4OH$ solution. The sidewall spacer 30, therefore, functions as an electrical insulator separating the silicide contact 38 on the gate electrode 16 from the metal silicide contacts 38 on the source/drain regions 34, as shown in FIG. 1B.

Various metals react with Si to form a silicide, however, titanium (Ti) and cobalt (Co) are currently the most common metals used to create silcides ($TiSi_2$, $CoSi_2$) when manufacturing semiconductor devices utilizing salicide technology.

Use of a $TiSi_2$ layer imposes limitations on the manufacture of semiconductor devices. A significant limitation is that the sheet resistance for lines narrower than 0.35 micrometers is high, i.e., as $TiSi_2$ is formed in a narrower and narrower line, the resistance increases. Another significant limitation is that $TiSi_2$ initially forms a high resistivity phase (C49), and transformation from C49 to a low resistivity phase (C54) is nucleation limited, i.e., a high temperature is required to effect the phase change.

Cobalt silicide, unlike $TiSi_2$, exhibits less linewidth dependence of sheet resistance. However, $CoSi_2$ consumes significant amounts of Si during formation, which increases the difficulty of forming shallow junctions. Large Si consumption is also a concern where the amount of Si present is limited, for example, with silicon on insulator (SOI) substrates. Without enough Si to react with Co to form $CoSi_2$, a thin layer of $CoSi_2$ results. The thickness of the silicide layer is an important parameter because a thin silicide layer is more resistive than a thicker silicide layer of the same material; thus a thicker silicide layer increases semiconductor device speed, while a thin silicide layer reduces device speed.

Recently, attention has turned towards using nickel to form NiSi utilizing salicide technology. Using NiSi is advantageous over using $TiSi_2$ and $CoSi_2$ because many limitations associated with $TiSi_2$ and $CoSi_2$ are avoided. When forming NiSi, a low resistivity phase is the first phase to form, and does so at a relatively low temperature. Additionally, nickel (Ni), like Co, diffuses through the film into Si, unlike Ti where the Si diffuses into the metal layer. Diffusion of Ni and Co through the film into Si prevents bridging between the silicide layer on the gate electrode and the silicide layer over the source/drain regions. The reaction that forms NiSi requires less Si than when $TiSi_2$ and $CoSi_2$ are formed. Nickel silicide exhibits almost no linewidth dependence of sheet resistance. Nickel silcide is normally annealed in a one step process, versus a process requiring an anneal, an etch, and a second anneal, as is normal for $TiSi_2$ and $CoSi_2$. Nickel silicide also exhibits low film stress, i.e., causes less wafer distortion.

In addition to the annealing step to form the silicide, there are additional high temperature heating steps in conventional MOS semiconductor device fabrication processes. Conventional processes also require one or more high temperature annealing steps to activate the source/drain regions and source/drain extensions. For example, in addition to the anneal at greater than 1,000° C. to activate the source/drain dopants, the formation of devices with $CoSi_2$ contacts requires a two-step annealing process which includes a first annealing at approximately 500° C. and a second annealing at approximately 800° C. Multiple high temperature heat treatment steps increase the manufacturing costs and the complexity of semiconductor device fabrication. High temperature annealing increases lateral and vertical diffusion of the dopants in the source/drain regions. Increased vertical diffusion of dopant results in slower, deeper junctions, while increased lateral diffusion of the dopant can result in junction leakage. Furthermore, every time a wafer is heated and cooled crystal damage from dislocations occur. A high concentration of dislocations can cause device failure from leakage currents.

The term semiconductor devices, as used herein, is not to be limited to the specifically disclosed embodiments. Semiconductor devices, as used herein, include a wide variety of electronic devices including flip chips, flip chip/package assemblies, transistors, capacitors, microprocessors, random access memories, etc. In general, semiconductor devices refer to any electrical device comprising semiconductors.

SUMMARY OF THE INVENTION

There exists a need in the semiconductor device manufacturing art to provide a process for forming metal silicide contacts for planar transistors with fewer high temperature annealing steps. There exists a need in this art to implant dopant in the source/drain regions without requiring a high temperature anneal to activate the dopants. There exists a need in this art to provide doped source/drain regions with metal siuicide contacts manufactured by a process requiring only one relatively low temperature anneal.

These and other needs are met by the embodiments of the present invention, which provide a method of manufacturing a semiconductor device comprising providing a silicon-containing semiconductor substrate having an upper surface and a gate electrode formed on the upper surface of the substrate with a gate insulating layer therebetween. The gate electrode has an upper surface and opposing side surfaces. Selected regions of the semiconductor substrate are made amorphous. Source/drain regions are formed in the amorphous regions by doping the semiconductor substrate with a dopant. A metal layer is subsequently deposited over the semiconductor substrate and the substrate is annealed, by a single heating step, to simultaneously activate the source/drain regions and to react the metal layer with silicon in the gate electrode and source/drain regions to form metal silicide contacts.

The earlier stated needs are also met by other embodiments of the present invention that provide a semiconductor device having a silicon-containing semiconductor substrate having an upper surface and a gate electrode formed on the upper surface with a gate insulating layer therebetween. The gate electrode has an upper surface and opposing side surfaces. Metal silicide contacts are formed on the upper surface of the gate electrode and over source/drain regions in the substrate that were formed by doping amorphous regions of the substrate.

The earlier stated needs are further met by other embodiments of the instant invention that provide a method of manufacturing a semiconductor device by activating dopants and forming silicide contacts on the device with a single annealing step comprising providing a silicon-containing semiconductor substrate. A gate oxide layer and a conductive gate material layer are, in turn, formed over the semiconductor substrate. The gate material layer and gate oxide layer are patterned to form a gate electrode having an upper surface and opposing side surfaces with a gate oxide layer below the gate electrode. Selected regions of the substrate are made amorphous by ion implanting a dopant into the selected regions of the substrate. Source/drain extensions are formed by ion implanting a dopant into the amorphous regions of the substrate. A layer of insulating material is deposited over the gate electrode and the semiconductor substrate and the insulating material is patterned to form sidewall spacers on the opposing side surfaces of the gate electrode. Source/drain regions are then formed by ion implanting a dopant into the amorphous regions. A metal layer is subsequently deposited on the upper surface of the gate electrode, the sidewall spacers, and the source/drain regions. The semiconductor substrate is annealed at a temperature sufficient to activate the source/drain regions and to cause the metal layer to react with silicon in the gate electrode and source/drain regions to form metal silicide contacts. Subsequently, the unreacted metal that did not form metal silicide is removed This invention addresses the need of an improved method of manufacturing semiconductor devices, with high conductivity silicide contacts on the source/drain regions and gate electrode, with fewer high temperature annealing steps. This invention reduces the possibility of semiconductor device crystal damage and junction leakage. This invention provides an economical manufacturing method requiring fewer heating step.

The foregoing and other features, aspects, and advantages of the present invention will become apparent in the following detailed description of the present invention when taken in conjunction with the accompanying drawings.

DETAILED DESCRIPTION OF THE INVENTION

Figure 1A:
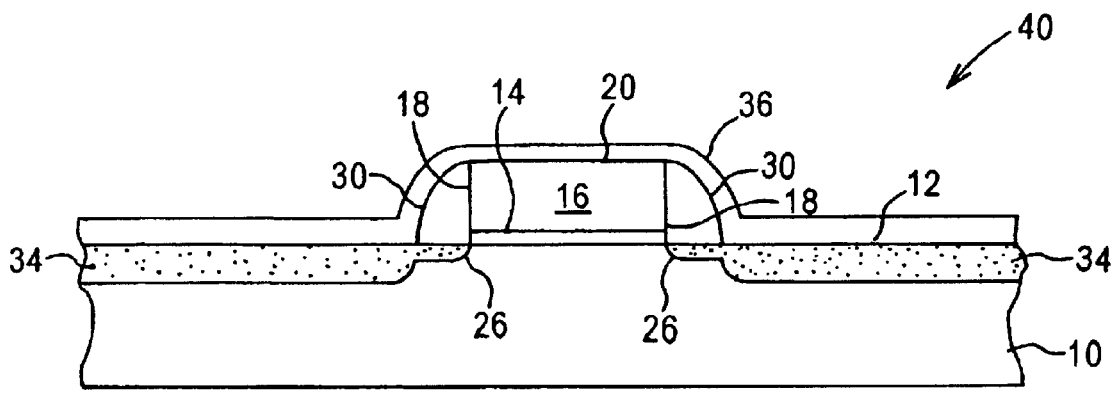
FIGS. 1A and 1B schematically illustrate a prior art semiconductor device before and after forming silicide contacts.
Figure 1B:
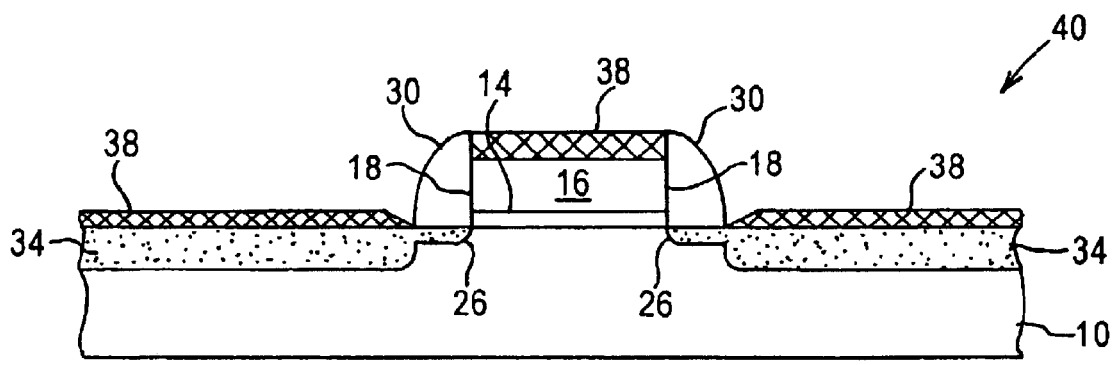

The present invention enables the production of semiconductor devices with improved performance and reduced failure rates by reducing the number of high temperature heat treatment steps that the semiconductor device undergoes during processing. The present invention provides semiconductor devices with reduced junction leakage. The present invention provides an improved semiconductor device with nickel silicide contacts formed with a single, low temperature anneal. These are achieved by forming source/drain implants, by ion implantation, in amorphous regions of a silicon-containing semiconductor substrate and performing a single, low temperature annealing step to both activate the source/drain regions and to form metal silcide contacts.

The invention will be described in conjunction with the formation of the semiconductor device in the accompanying drawings. However, this is exemplary only, as the claimed invention is not limited to the formation of and the specific device illustrated in the drawings.

Figure 2A:
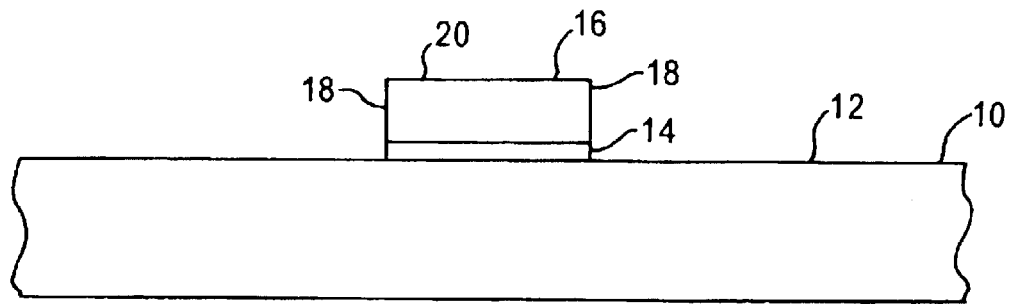
FIGS. 2A–2H schematically illustrate the formation of metal silicide contacts for semiconductor devices according to an embodiment of the present invention.

A silicon-containing semiconductor substrate 10 having an upper surface 12 is illustrated in FIG. 2A. A gate oxide layer 14 and conductive gate material layer 16 are formed on the semiconductor upper surface 12 and then patterned by conventional photolithographic techniques to form gate electrode 16 overlying gate oxide layer 14. Polysilicon is an exemplary conductive gate material.

Figure 2B:
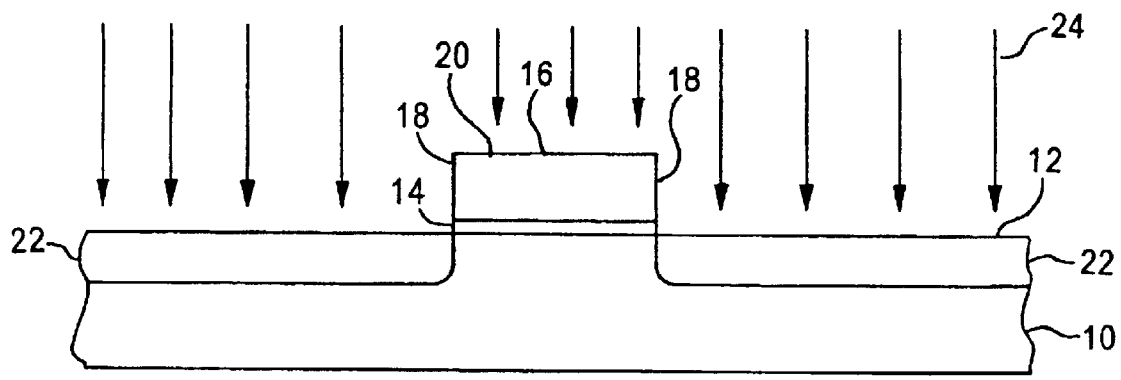

Selected regions of the substrate 22 are made amorphous by ion implanting an electrically neutral dopant 24 into substrate 10, as shown in FIG. 2B. Silicon, germanium, argon, and xenon are exemplary electrically neutral dopants for making crystalline substrates amorphous. The electrically neutral dopant is implanted at an implantation dosage of about $1 \times 10^{14}$ ions/cm$^2$ to about $5 \times 10^{15}$ ions/cm$^2$ and an implantation energy of about 10 keV to about 100 keV. In certain embodiments of the present invention, an implantation dosage of about $1\times10^{14}$ to about $1\times10^{15}$ ions/cm$^2$ and an implantation energy of about 10 keV to about 70 keV is effective for forming amorphous regions 22 in the substrate 10. The substrate undergoes amorphization implant for a length of time ranging from about 30 seconds to about 10 minutes.

The amorphization, as will be described in more detail later, allows the activation of implanted dopants at a lower temperature than the surrounding cystralline portions of the substrate. This controls the size of the active regions.

Figure 2C:
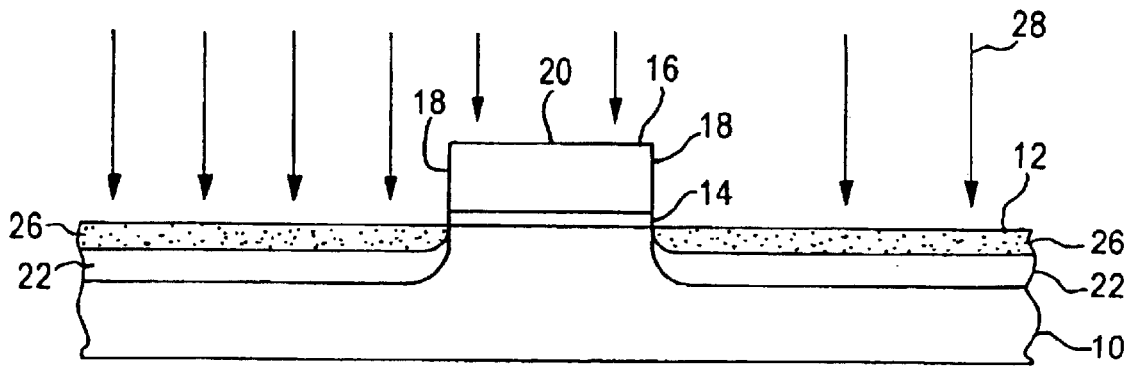
Figure 2D:
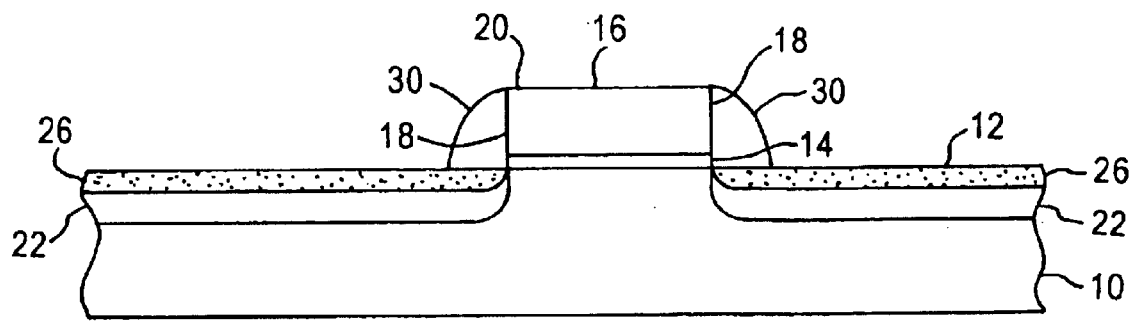

Source/drain extensions 26 are formed by ion implanting a dopant 28 (e.g., As, B, etc.) into the amorphous regions 22. Ion implantation to form the source/drain extensions is performed at an implantation dosage of about $1\times10^{14}$ ions/cm$^2$ to about $1\times10^{15}$ ions/cm$^2$ and an implantation energy of about 1 keV to about 10 keV (FIG. 2C). After forming the source/drain extensions 26, dielectric sidewall spacers 30 are formed on the opposing sidewalls 18 of the gate electrode 16. A dielectric layer, e.g. silicon oxide, silicon nitride, or silicon carbide, is deposited over the gate electrode upper surface 20 and substrate upper surface 12 and patterned using an anisotropic etch to form the sidewall spacers 30, as shown in FIG. 2D.

Figure 2E:
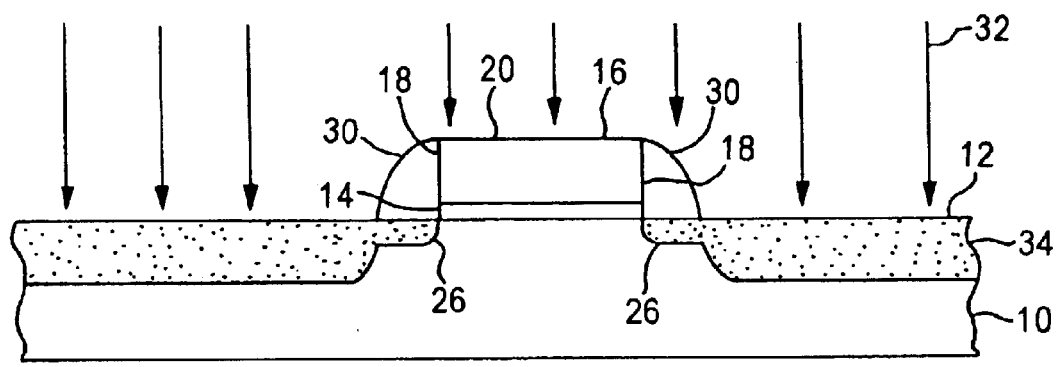

Source/drain regions 34 are formed by implanting dopant 32 into the amorphous regions 22, as shown in FIG. 2E. The source/drain regions are formed by ion implantation at an implantation dosage of about $1\times10^{15}$ ions/cm$^2$ to about $6\times10^{15}$ ions/cm$^2$ and at an implantation energy of about 10 keV to about 70 keV. In certain embodiments of the present invention, an implantation energy of about 10 keV to about 30 keV has been found effective in forming the source/drain regions. Conventional dopants, such as As, B, BF$_2$, P, or Sb are advantageously used to form the source/drain regions and extensions.

Figure 2F:
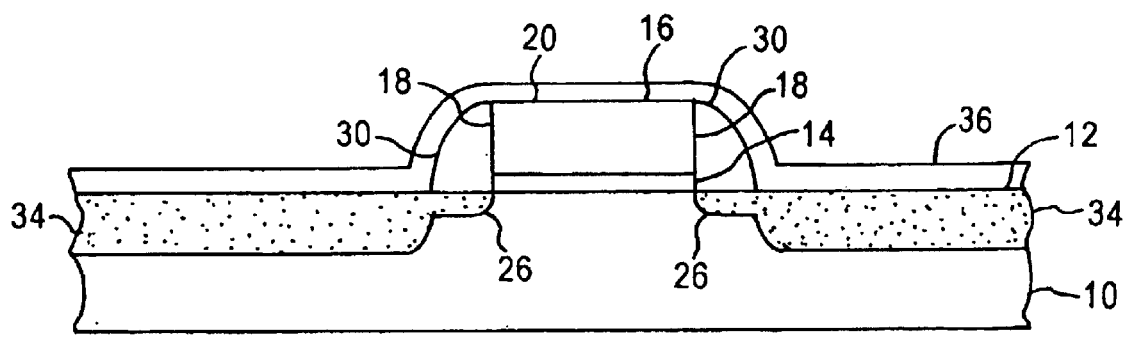

A metal layer 36 is deposited over the upper surface of the substrate 12, sidewall spacers 30, and the gate electrode upper surface 20 (FIG. 2F). Metal layer 36 is deposited by a PVD method, such as sputtering or evaporation, or a CVD method. The metal layer 36 is deposited to a thickness of about 100 Å to about 500 Å. The metal layer 36 can comprise Co, Ni, Ti, Mo, Ta, W, Cr, Pt, or Pd. Ni is a preferred metal for the present invention because it forms nickel silcide (NiSi) by a lower temperature, single step anneal, among the other reasons herein described.

Figure 2G:
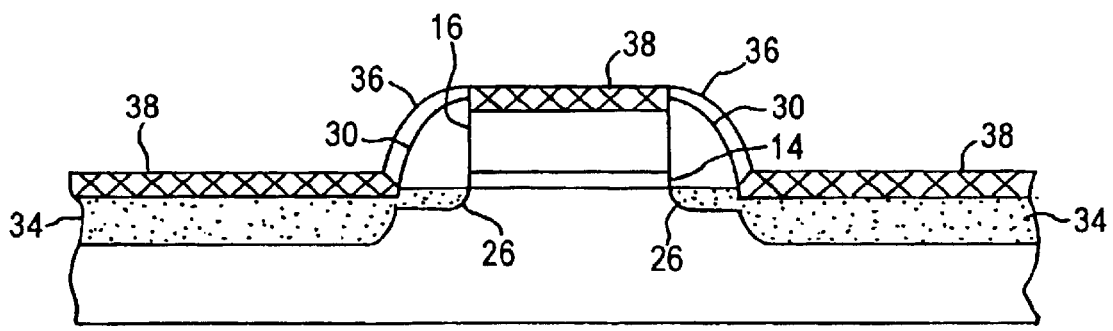
Figure 2H:
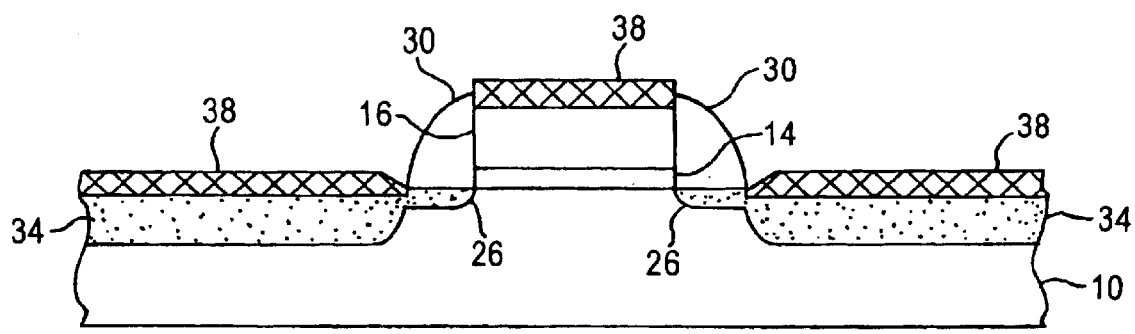

The deposited metal layer 36 is subsequently annealed to form the metal silicide contacts 38, as shown in FIG. 2G. The metal layer 36 is heated at a temperature of about 350° C. to about 850° C., for about 30 seconds to about 60 minutes. The heating causes the metal layer 36 to react with underlying silicon in the source/drain regions 34 and gate electrode 16. The metal layer 36 does not react with the dielectric sidewall spacers 30. In certain embodiments, such as when metal layer 36 is Ni, the annealing is performed at a temperature of about 500° C. to about 650° C. for about 1 minute to about 30 minutes. If the annealing temperature is below about 350° C. or greater than 700° C. relatively low conductivity Ni$_2$Si or NiSi$_2$, are respectively formed, when Ni is the metal layer 36. After formation of the metal silcide contacts 38, the metal layer 36 which did not react to form metal silcide 38 is removed by etching, as with a wet etchant, e.g., an aqueous H$_2$O$_2$/NH$_4$OH solution, to provide the device shown in FIG. 2H.

Substrate amorphization enables the formation of shallow source/drain junctions. The amorphization step defines the depth of the source/drain junction, which is at the amorphous region 22/crystalline substrate 10 interface. The amorphous region 22 recrystallizes and becomes electrically activated during the silicidation anneal. Metal silcides which form at low temperature, such as NiSi are preferred because the annealing temperature is not high enough to activate any dopant which may have been implanted into the crystalline substrate 10 below the amorphous region 22. At temperatures below about 650° C. dopant in the crystalline regions of the substrate 10 will not become activated. Therefore, without the amorphization step, the annealing temperature to form nickel silcide, about 500° C. to about 650° C., would not be sufficient to activate the dopant in the source/drain regions.

The low annealing temperature, about 500° C. to about 650° C., further prevents dopant diffusion. Thus, the final profile of the source/drain junction is essentially determined by the asimplanted profile. Prevention of dopant diffusion further helps to create and maintain shallow source/drain junctions.

Figure 3A:
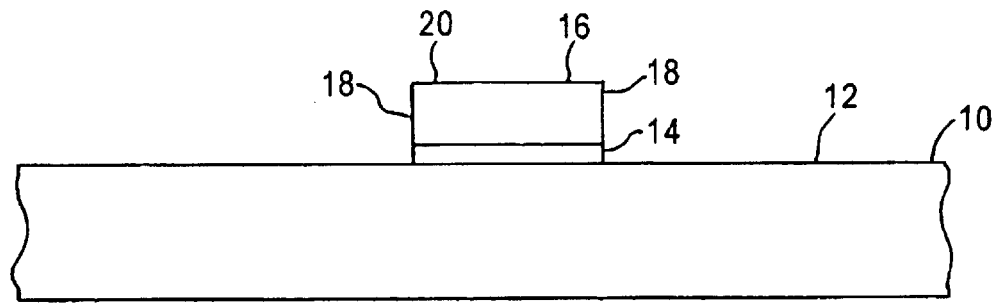
FIGS. 3A–3I schematically illustrate formation of metal silicide contacts for semiconductor devices according to another embodiment of the present invention.

Another embodiment of the present invention is described in conjunction with FIGS. 3A–3I. A silicon-containing semiconductor substrate 10 having an upper surface 12 is illustrated in FIG. 3A. A gate oxide layer 14 and conductive gate material layer 16 are formed on the semiconductor upper surface 12 and then patterned by conventional photolithographic techniques to form gate electrode 16 overlying gate oxide layer 14.

Figure 3B:
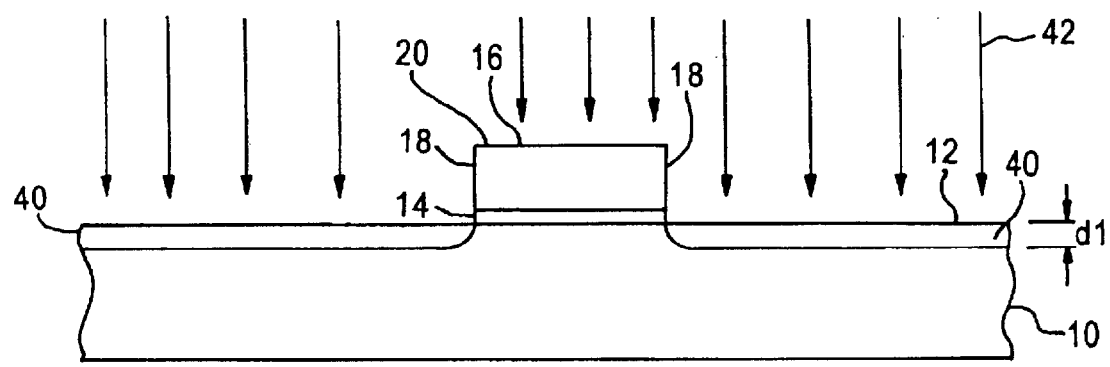

First selected regions of the substrate 40 are made amorphous by ion implanting an electrically neutral dopant 42 into substrate 10 to a first depth d1, as shown in FIG. 3B. Silicon, germanium, argon, and xenon are exemplary electrically neutral dopants. The electrically neutral dopant is implanted at an implantation dosage of about $1\times10^{14}$ ions/cm$^2$ to about $5\times10^{15}$ ions/cm$^2$ and an implantation energy of about 5 keV to about 80 keV. In certain embodiments of the present invention, an implantation dosage of about $1\times10^{14}$ to about $1\times10^{15}$ ions/cm$^2$ keV is effective for forming amorphous regions 40 in the substrate 10.

Figure 3C:
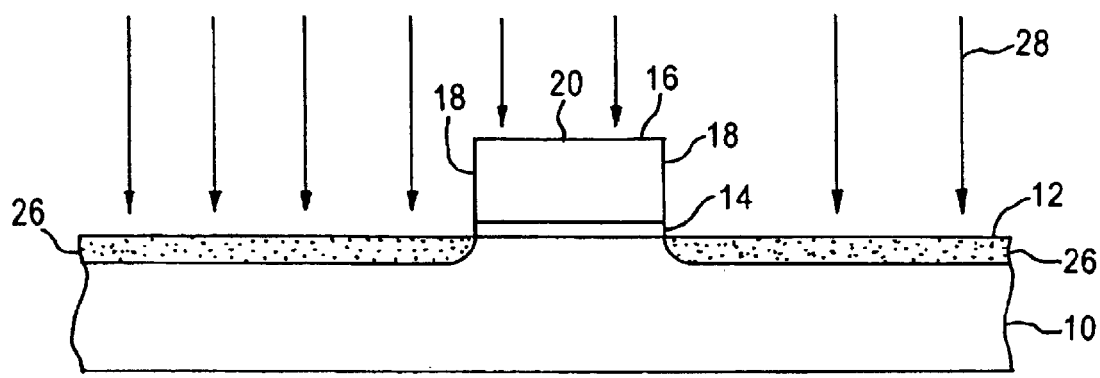
Figure 3D:
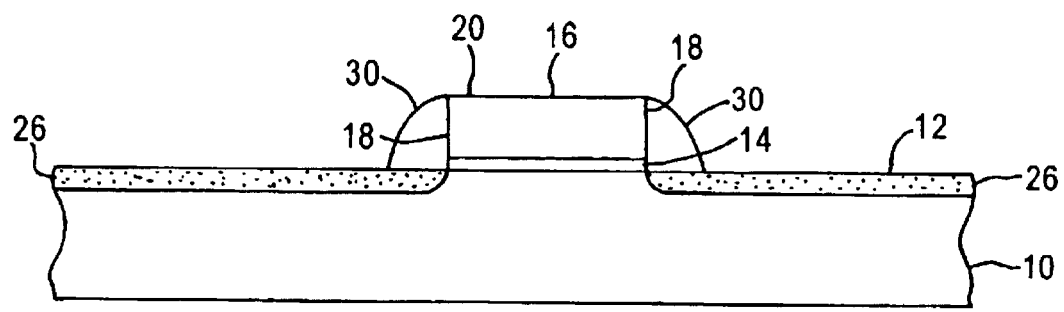

Source/drain extensions 26 are formed by ion implanting a dopant 28 into the amorphous regions 40. Ion implantation to form the source/drain extensions is performed at an implantation dosage of about $1\times10^{14}$ ions/cm$^2$ to about $1\times10^{15}$ ions/cm$^2$ and an implantation energy of about 1 keV to about 10 keV (FIG. 3C). After forming the source/drain extensions 26, dielectric sidewall spacers are formed on the opposing sidewalls 18 of the gate electrode 16. A dielectric layer is deposited over the gate electrode upper surface 20 and substrate upper surface 12 and patterned using an anisotropic etch to form the sidewall spacers 30, as shown in FIG. 3D.

Figure 3E:
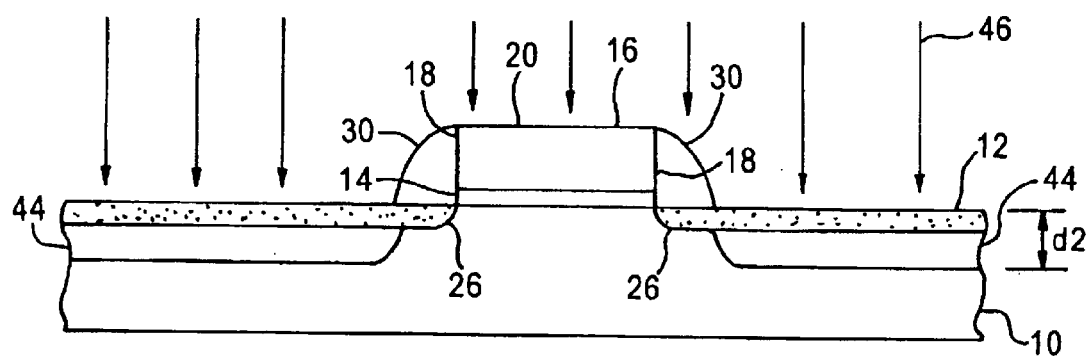

Second selected regions of the substrate 44 are made amorphous by ion implanting an electrically neutral dopant 46 into substrate 10 to a second depth d2 greater than the first depth d1, as shown in FIG. 3E. The electrically neutral dopant is implanted at an implantation dosage of about $1\times10^{14}$ ions/cm$^2$ to about $5\times10^{15}$ ions/cm$^2$ and an implantation energy of about 10 keV to about 100 keV.

Figure 3F:
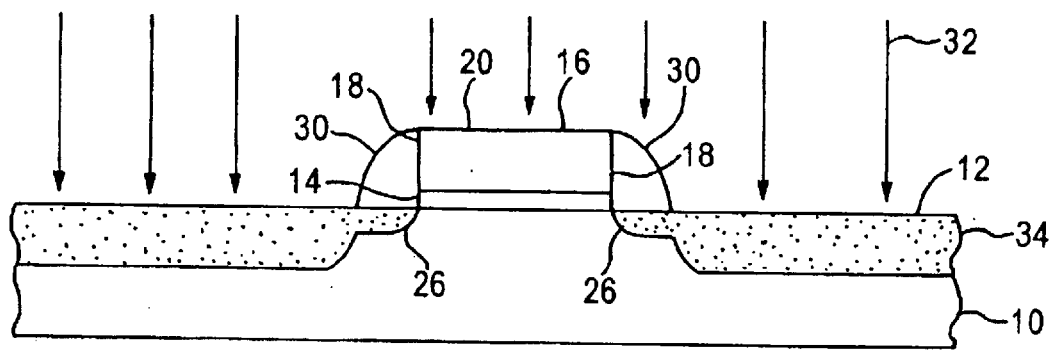
Figure 3G:
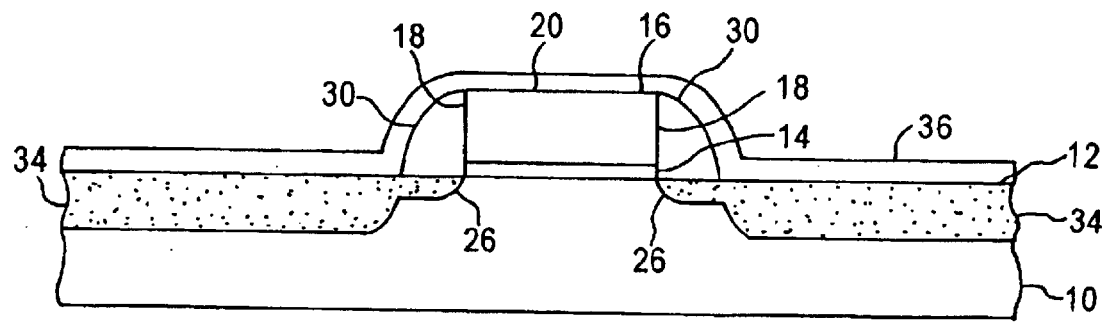

Source/drain regions 34 are formed by implanting dopant 32 into the amorphous regions 44, as shown in FIG. 3F. The source/drain regions are formed by ion implantation at an implantation dosage of about $1\times10^{15}$ ions/cm$^2$ to about $6\times10^{15}$ ions/cm$^2$ and at an implantation energy of about 10 keV to about 70 keV. In certain embodiments of the present invention, an implantation energy of about 10 keV to about 30 keV has been found effective in forming the source/drain regions. Conventional dopants, such as As, B, BF$_2$, P, or Sb are advantageously used to form the source/drain regions and extensions.

A metal layer 36 is deposited over the upper surface of the substrate 12, sidewall spacers 30, and the gate electrode upper surface 20 (FIG. 3G) as described in the previous embodiments.

Figure 3H:
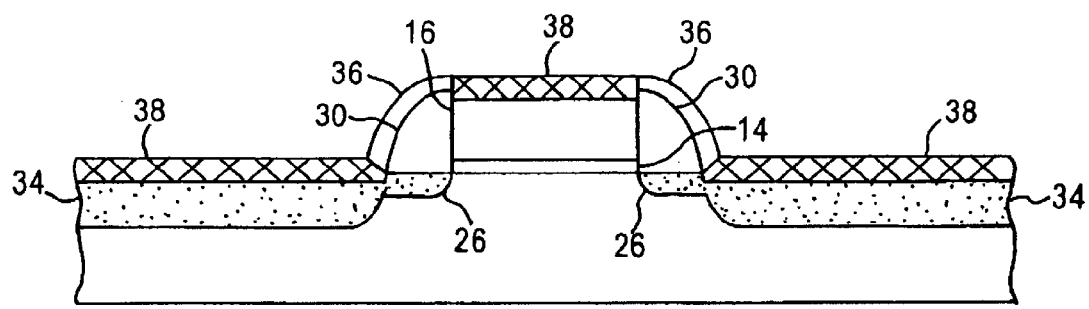
Figure 3I:
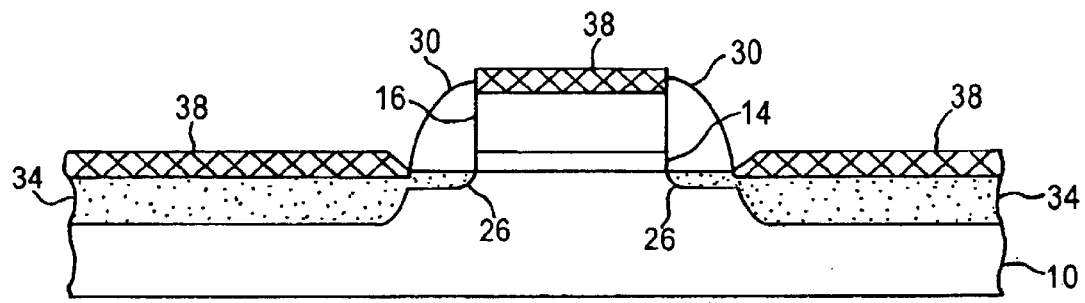

The deposited metal layer 36 is subsequently annealed as described in the previous embodiments to form the metal silicide contacts 38, as shown in FIG. 3H. After formation of the metal silicide contacts 38, the metal layer 36 which did not react to form metal silicide 38 is removed by etching, as described in the previous embodiments, to provide the device shown in FIG. 3I.

By combining amorphization of the substrate prior to forming the source/drain regions with nickel silicide contacts, high conductivity, high reliability semiconductor devices are formed without multiple annealing steps. The present invention provides the benefits of shallow junction MOS transistors with reduced crystal damage due to high temperature annealing. In addition, the formation of semiconductor devices with only a single annealing step, enables a more economical semiconductor device manufacturing process.

The embodiments illustrated in the instant disclosure are for illustrative purposes only, and should not be construed to limit the scope of the claims. As is clear to one of ordinary skill in the art, the instant disclosure encompasses a wide variety of embodiments not specifically illustrated herein.

What is claimed is:

1. A method of manufacturing a semiconductor device, the method comprising:

providing a silicon-containing semiconductor substrate, having an upper surface, comprising: a gate electrode formed on the substrate upper surface with a gate insulating layer therebetween, the gate electrode having an upper surface and opposing side surfaces;

amorphizing selected regions of the semiconductor substrate;

forming source/drain regions by doping the selected regions of the semiconductor substrate with a dopant;

depositing a metal layer over the semiconductor substrate; and annealing the semiconductor substrate, wherein said metal layer is exposed, with a single heating step at a temperature of about 350° C. to less than about 850° C. for about 30 seconds to 60 minutes, to simultaneously activate the source/drain regions and to react the metal layer with underlying silicon in the gate electrode and source/drain regions to form metal silicide contacts.

2. The method according to claim 1, wherein the step of amorphizing selected regions of the semiconductor substrate comprises ion implantation of an electrically neutral dopant into the substrate.

3. The method according to claim 2, wherein the electrically neutral dopant is selected from the group consisting of silicon, germanium, argon, and xenon.

4. The method according to claim 3, comprising ion implanting the electrically neutral dopant at an implantation dosage of about $1 \times 10^{14}$ ions/cm$^2$ to about $5 \times 10^{15}$ ions/cm$^2$ and an implantation energy of about 10 keV to about 100 keV.

5. The method according to claim 4, wherein the implantation dosage is about $1 \times 10^{14}$ to about $1 \times 10^{15}$ ions/cm$^2$ and the implantation energy is about 10 keV to about 70 keV.

6. The method according to claim 1, further comprising after the step of amorphizing selected regions of the semiconductor substrate:

forming source/drain extensions in the substrate by ion implantation of a dopant; and forming sidewall spacers on the opposing side surfaces of the gate electrode before the step of forming source/drain regions.

7. The method according to claim 6, wherein the ion implantation to form the source/drain extensions is performed at an implantation dosage of about $1 \times 10^{14}$ ions/cm$^2$ to about $1 \times 10^{15}$ ions/cm$^2$ and an implantation energy of about 1 keV to about 10 keV.

8. The method according to claim 1, wherein the source/drain regions are formed by ion implantation, and the ion implantation is performed at an implantation dosage of about $1 \times 10^{15}$ ions/cm$^2$ to about $6 \times 10^{15}$ ions/cm$^2$ and an implantation energy of about 10 keV to about 70 keV.

9. The method according to claim 8, wherein the ion implantation energy is about 10 keV to about 30 keV.

10. The method according to claim 1, wherein the deposited metal is Ni.

11. The method according to claim 1, wherein the metal layer has thickness of about 100 Å to about 500 Å.

12. The method according to claim 1, wherein the annealing is performed at a temperature of about 500° C. to less than about 650° C. for about 1 minute to about 30 minutes.

13. The method according to claim 1, further comprising removing the metal that did not react to form silicide.

14. The method according to claim 1, wherein the step of amorphizing selected regions of the semiconductor substrate further comprises:

amorphizing first selected regions of the semiconductor substrate to a first depth;

forming source/drain extensions in the substrate by ion implantation of a dopant;

forming sidewall spacers on the opposing side surfaces of the gate electrode; and amorphizing second selected regions of the semiconductor substrate to a second depth greater than said first depth.

15. The method according the claim 14, wherein the steps of amorphizing the first and second selected regions of the semiconductor substrate comprises ion implantation of electrically neutral dopant into the substrate.

16. The method according to claim 15, wherein the electrically neutral dopant is selected from the group consisting of silicon, germanium, argon, and xenon.

17. The method according to claim 16, wherein the step of amorphizing the first selected regions comprises ion implanting the electrically neutral dopant at an implantation dosage of about $1 \times 10^{14}$ ions/cm$^2$ to about $5 \times 10^{15}$ ions/cm$^2$ and an implantation energy of about 5 to about 80 keV.

18. The method according to claim 16, wherein the step of amorphizing the second selected regions comprises ion implanting the electrically neutral dopant at an implantation dosage of about $1 \times 10^{14}$ ions/cm$^2$ to about $5 \times 10^{15}$ ions/cm$^2$ and an implantation energy of about 10 keV to about 100 keV.

19. A method of manufacturing a semiconductor device by activating dopants and forming silicide contacts with a single annealing step, the method comprising:

providing a silicon-containing semiconductor substrate;

forming a gate oxide layer on the semiconductor substrate;

forming a conductive gate material layer over the gate oxide layer;

patterning the gate material layer and gate oxide layer to form a gate electrode having an upper surface and opposing side surfaces, with a gate oxide layer thereunder;

making selected regions of the substrate amorphous by ion implanting a dopant into the selected regions of the substrate;

forming source/drain extensions by ion implanting a dopant into the amorphous regions of the substrate;

depositing a layer of insulating material over the gate electrode and semiconductor substrate;

patterning the insulating material to form sidewall spacers on the opposing side surfaces of the gate electrode;

forming source/drain regions by ion implanting a dopant into the amorphous regions;

depositing a metal layer on the upper surface of the gate electrode, the sidewall spacers, and the source/drain regions;

annealing the semiconductor substrate, wherein said metal layer is exposed, with a single heating step at a temperature sufficient to activate the source/drain regions and to cause the metal layer to react with silicon in the gate electrode and the source/drain regions to form metal silicide contacts; and removing the unreacted metal that did not form metal silicide.

20. The method according to claim 19, comprising ion implanting the electrically neutral dopant at an implantation dosage of about $1\times10^{14}$ ions/cm$^2$ to about $5\times10^{15}$ ions/cm$^2$ and an implantation energy of about 10 keV to about 100 keV;

ion implanting the dopant to form the source/drain extensions at an implantation dosage of about $1\times10^{14}$ ions/cm$^2$ to about $1\times10^{15}$ ions/cm$^2$ and an implantation energy of about 1 keV to about 10 keV; and ion implanting the dopant to form the source/drain regions at an implantation dosage of about $1\times10^{15}$ ions/cm$^2$ to about $6\times10^{15}$ ions/cm$^2$ and an implantation energy of about 10 keV to about 70 keV.

21. The method according to claim 19, wherein the metal layer is Ni.

22. The method according to claim 21, wherein the temperature to activate the source/drain regions and to form NiSi is less than 850° C.

23. The method according to claim 22, wherein the temperature to activate the source/drain regions and to form NiSi is less than 650° C.

* * * * *